United States Patent
Divekar et al.

(10) Patent No.: US 9,558,302 B2
(45) Date of Patent: Jan. 31, 2017

(54) DESIGNING A CIRCULAR STAGGERED PATTERN OF OBJECTS

(71) Applicant: Dassault Systèmes, Velizy Villacoublay (FR)

(72) Inventors: Ameya Divekar, Pune (IN); Sameer Kulkarni, Pune (IN); Jean-Louis Delvordre, Rueil-Malmaison (FR)

(73) Assignee: Dassault Systemes, Velizy Villacoublay (FR)

( * ) Notice: Subject to any disclaimer, the term of this patent is extended or adjusted under 35 U.S.C. 154(b) by 704 days.

(21) Appl. No.: 14/081,844

(22) Filed: Nov. 15, 2013

(65) Prior Publication Data

US 2014/0136156 A1    May 15, 2014

(30) Foreign Application Priority Data

Nov. 15, 2012  (EP) .................................... 12306427

(51) Int. Cl.
  *G06F 17/50*   (2006.01)
  *G06T 19/20*   (2011.01)

(52) U.S. Cl.
  CPC .............. *G06F 17/50* (2013.01); *G06T 19/20* (2013.01); *G06T 2219/2004* (2013.01); *G06T 2219/2021* (2013.01)

(58) Field of Classification Search
  USPC .......................................................... 703/1
  See application file for complete search history.

(56) References Cited

U.S. PATENT DOCUMENTS

| 2003/0043154 A1 | 3/2003 | Nimura et al. |
| 2004/0153186 A1 | 8/2004 | Khurana |
| 2008/0301572 A1 | 12/2008 | Wengler |

FOREIGN PATENT DOCUMENTS

| EP | 1 995 673 A1 | 11/2008 |
| EP | 2 523 131 A1 | 11/2012 |
| FR | 2 793 926 A1 | 11/2000 |
| WO | WO 02/097735 A1 | 12/2002 |

OTHER PUBLICATIONS

Lampart, Piotr, and Sergey Yershov. "3D shape optimisation of turbomachinery blading." Task quarterly 6, No. 1 (2002): 113-125.*

(Continued)

*Primary Examiner* — Aniss Chad
(74) *Attorney, Agent, or Firm* — Hamilton, Brook, Smith & Reynolds, P.C.

(57) ABSTRACT

The invention is directed to computer-implemented method for designing a staggered pattern of objects in a computer-aided design system. The method comprises providing a rotation axis that is the origin of two or more concentric circles, providing a reference object to be multi-instantiated, defining the number of objects to be instantiated from the reference object on each concentric circle, defining an angular shift, instantiating the number of objects from the reference object on each concentric circle, the instantiated objects being spaced according to an angular deviation between two consecutive instantiated objects on a given concentric circle, in one of every two concentric circle, shifting the instantiated objects in accordance with the angular shift.

18 Claims, 5 Drawing Sheets

(56) References Cited

OTHER PUBLICATIONS

Day, A. M., et al., "Combining Polygonal and Subdivision Surface Approaches to Modeling Urban Environments," *Cyberworlds*: 189-197 (2003).
Emering L., et al., "Live Participant's Action Recognition for Virtual Reality Interactions," *Computer Graphics and Applications*: 15-21 (1997).
Example: Pattern Driven by a Relation [online], [retrieved on Mar. 5, 2014]. Retrieved from the Internet URL: http://www.cadlab.tuc.gr/proehelp/welcome/using_th.htm.
Havemann, S., "Generative Mesh Modeling," Unpublished Dissertation, Institut fur ComputerGraphik. (2005).
Hui, K. C., "Axial Representation for Modelling 3D Shapes," *Information Visualization*:401-406 (2000).
Marhl, M., et al., "Extensions of Sweep Surface Constructions," *Comput & Graphics*, 20(6):893-903 (1996).
Marvie, J.-E., et al., "The FL-System: a Functional L-System for Procedural Geometric Modeling," *Visual Comput*, 21:329-339 (2005).
Nur, M. A., et al., "Animating the Escape Response of the Sea Anemone, *Stomphia coccinea* From the Starfish, *Dermasterina imbricata* Modeled Using Implicit Surfaces," *Computer Graphics International*: 81-88 (2001).
Pratt, M. J., "Extension of ISO 10303, the STEP Standard, for the Exchange of Procedural Shape Models," *Shape Modeling Applications*: 317-326 (2004).
Pratt, M. J., et al., "Towards the Standardized Exchange of Parameterized Feature-Based CAD Models," *Computer-Aided Design*, 37:1251-1265 (2005).
Smith, S. G. Pattern Relations. Pro/E the Magazine [online], Jun. 1998 [retrieved on Mar. 5, 2014]. Retrieved from the Internet URL: http://web.archive.org/web/20011221184718/http://www.cadquest.com/articles/art5.htm.
Sohrt, W. and Brilderlin, B. D., "Interaction with Constraints in 3D Modeling," *ACM*:387-396 (1991).
Van Emmerik, M. J. G. M., "Interactive Design of 3D Models with Geometric Constraints," *The Visual Computer*, 7:309-325 (1991).
Anonymous: "Appendix F—Activity: Fill Pattern," Solid Edge Velocity Series—Constructing Procedural Features—Publication No. spse01535, Oct. 5, 2010 (Oct. 5, 2010), 24 pages, XP055020830, Retrieved from the Internet: URL: http://www.solidedge.com/spt/en/ST3/pdf/spse01535.pdf, retrieved Mar. 2, 2012.
Anonymous: "Pattern Features," Solid Edge Velocity Series—Constructing Procedural Features—Publication No. spse01535, Oct. 5, 2010 (Oct. 5, 2010), 44 pages, XP055007523, Retrieved from the Internet: URL:http://www.solidedge.com/spt/en/ST3/pdf/spse01535.pdf, retrieved on Sep. 19, 2011.
Wikipedia, et al.: "Generative Modelling Language (old revision of the page, as edited by A1 Fecund at 13:36, Dec. 25, 2006)" Internet Citation, Dec. 25, 2006 (Dec. 25, 2006), 4 pages, XP007902780, Retrieved from the Internet: URL:http://en.wikipedia.org/w/index/php?title=Generative_Modelling_Language&oldid=96411198, retrieved on Aug. 10, 2007.
European Search Report from European Application No. 12 30 6427, dated Apr. 9, 2013, 11 pages.

* cited by examiner

DESIGNING A CIRCULAR STAGGERED PATTERN OF OBJECTS

RELATED APPLICATION(S)

This application claims priority under 35 U.S.C. §119 or 365 to European Application No. 12306427.1, filed Nov. 15, 2012.

The entire teachings of the above application(s) are incorporated herein by reference.

FIELD OF THE INVENTION

The invention relates to the field of computer programs and systems, and more specifically to a method, system and program for designing a circular staggered pattern of objects.

BACKGROUND OF THE INVENTION

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behaviour of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

CAD systems provide an intuitive and flexible user interface for designing precise 3D mechanical parts, from sketching in an assembly context to iterative detailed design. Such a solution is provided by CATIA Part Design (trademark) application which combines the power of feature-based design with the flexibility of a Boolean approach, offers a highly productive and intuitive design environment with multiple design methodologies, such as post-design and local 3D parameterization.

During the process of mechanical parts design, the designer may need to create several identical features from an existing one and to simultaneously position them on a part. To this aim, the designer generally uses patterns that allow to duplicate an original feature at a location chosen in the part by the designer. Common patterns are rectangular pattern and circular pattern. The designer may also need a particular pattern (also referred to as user pattern) that is created by hand by the designer. For instance, the designer selects a set of points on which the original feature will be duplicated.

The creation of a circular staggered pattern of objects requires performing several steps, as illustrated on FIGS. 2 to 4. First, the designer creates an initial part comprising a reference object and a duplicate reference object; for instance, on FIG. 2, a circular pad 200 comprises a first hole 202 that is the reference object and a second hole that is the duplicate reference object 204. The duplicate reference object is placed on the pad with an angular shift θ from the reference object and a distance d2 from the centre O of the pad which is larger that the distance d1 between the reference object and the centre O of the pad. Next, the designer creates a first pattern by duplicating the reference feature according to a circular pattern, as shown on FIG. 3. Then, the designer creates a second pattern for duplicating the duplicate reference feature according to a circular pattern. Finally, the first and second patterns are combined or merged for obtaining the requested staggered pattern, as illustrated on FIG. 4.

The creation of a staggered pattern of objects can also be performed by using a user pattern. It consists in creating a sketch of point representing each location of duplicate reference features, and creating a pattern by selecting a reference feature to duplicate and the sketch of points. Again, several steps are required.

Likewise, the modification of a pattern requires the designer to perform several steps. For instance, starting from a circular staggered pattern of objects as the one illustrated on FIG. 4, the designer has to modify the angular shift of the duplicate reference feature (such as the duplicate reference feature 204 on FIG. 2) in relation with reference feature (such as the reference feature 200 on FIG. 2). Then, the designer has to edit the first and second patterns and reduce the number of instances of the reference feature. Finally, the modified part is obtained.

The creation and the modification of a circular staggered pattern of objects thus require the designer to perform several steps. It requires added actions to create the geometry (e.g. creation of an angular shift, creation of two patterns, or creation of sketch), which is a cumbersome task and time consuming as well.

Within this context, there is still a need for an improved method for designing a circular staggered pattern of objects in a computer-aided design system.

SUMMARY OF THE INVENTION

According to one aspect, the invention therefore provides a computer-implemented method for designing a staggered pattern of objects in a computer-aided design system. The method comprises:

providing a rotation axis that is the origin of two or more concentric circles;
providing a reference object to be multi-instantiated;
defining the number of objects to be instantiated from the reference object on each concentric circle;
defining an angular shift;
instantiating the number of objects from the reference object on each concentric circle, the instantiated objects being spaced according to an angular deviation between two consecutive instantiated objects on a given concentric circle;
in one of every two concentric circle, shifting the instantiated objects in accordance with the angular shift.

The method may comprise one or more of the following:
defining the number of concentric circles;
defining a spacing between two consecutive concentric circles;
the two or more concentric circles are positioned in a same plane;
placing a first instantiated object on one of the two or more concentric circles;
computing a radial axis passing from the rotation axis to said first instantiated object;
instantiating the remaining objects on each concentric circle, the remaining instantiated objects being spaced according to the angular deviation measured from the radial axis;
the step of shifting the instantiated objects in accordance with the angular shift in one of every two concentric circles is not performed for the circles that comprises the first instantiated object;
the first instantiated object is placed on the concentric circle having the smallest radius;
shifting the instantiated objects previously shifted in accordance with a second angular shift that is the opposite to the angular shift;
defining, upon user action, the angular deviation between two consecutive instantiated objects on a given concentric circle;
displaying the two or more concentric circles before the step of shifting.

The invention further proposes a computer program comprising instructions for execution by a computer, the instructions comprising means for performing the steps of the method of the invention.

The invention further proposes a computer readable storage medium having recorded thereon the above computer program.

The invention further proposes a system comprising
a storage system for storing a reference object to be multi-instantiated;
a processing unit for performing the step of the method of the invention.

BRIEF DESCRIPTION OF THE DRAWINGS

Embodiments of the invention will now be described, by way of non-limiting example, and in reference to the accompanying drawings, where.

Figure 1:
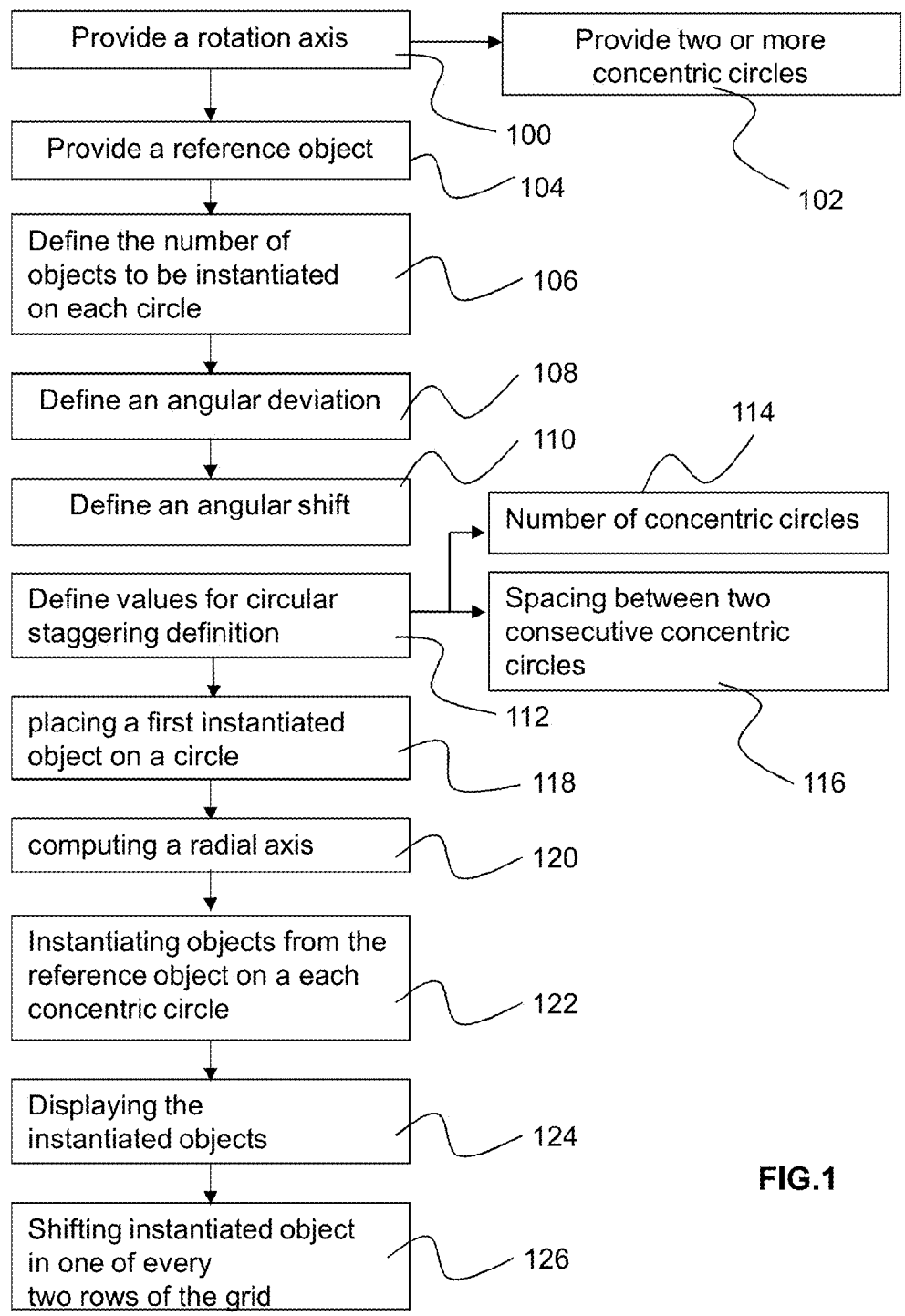
FIG. 1 shows a flowchart of an example of the method.
Figure 2:
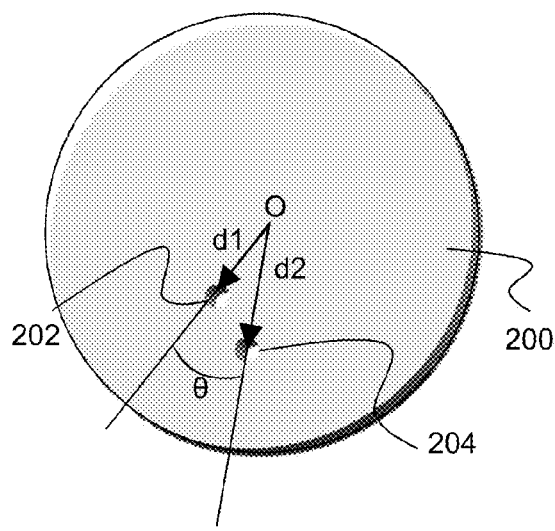
FIGS. 2 to 4 are examples of the creation of a circular staggered pattern of objects as known in the prior art.
Figure 3:
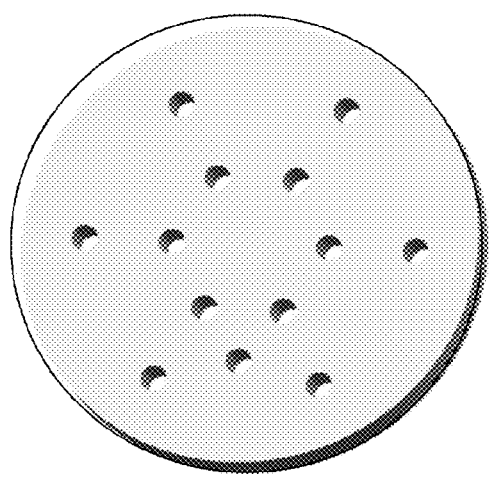
Figure 4:
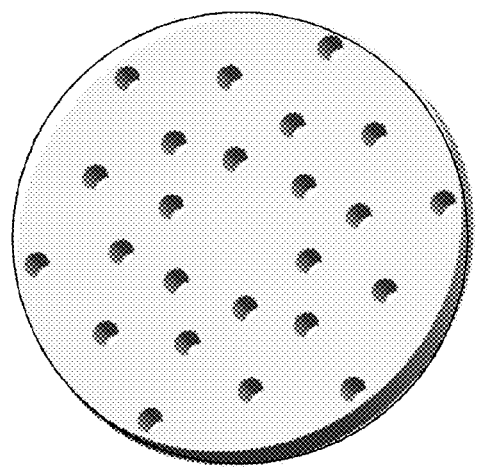

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The teachings of all patents, published applications and references cited herein are incorporated by reference in their entirety.

It is proposed a computer-implemented method for designing a staggered pattern of objects in a computer-aided design (CAD) system. The method comprises providing a rotation axis that is the origin of two or more concentric circles. Rotation axis means the line around which an object rotates. Origin means that the rotation axis serves as the centre of a circle. The two or more circles are concentric, which means that they share the same rotation axis (also referred to as centre or origin) with one inside the other. The method further comprises providing a reference object to be multi-instantiated. The reference object may be a three-dimensional (3D) modeled object, indifferently referred to as a modeled object or object thereafter. The method further comprises defining the number of objects to be instantiated from the reference object on each concentric circle. Defining the number of object means that a selection of a number is performed, e.g. by a system or by a user. The method further comprises defining an angular shift. Angular shift means a rotation angle of a rotation about the rotation axis. The method additionally comprises instantiating from the reference object the number of objects on each concentric circle, the instantiated objects being spaced according to an angular deviation between two consecutive instantiated objects on a given concentric circle. The instantiation of an object is performed as known in the art. The instantiation create an instance by defining one particular variation of the reference object. Typically, the reference object is a file comprising data representing a modeled object, and an instantiated reference object is an executable file that can be used by a CAD system e.g. for displaying the representation of the modeled object. The instantiated reference objects may be stored in memory and can be accessed and used by the CAD system. The instantiated reference objects are spaced according to an angular deviation; this involves that two consecutive objects on a concentric circle are not located on the same location. The method further comprises a step of shifting, in one of every two concentric circle, the instantiated objects of in accordance with the angular shift. Shifting the instantiated objects means that they are moved from a first position to a second position along one concentric circle, the space between the instances of the reference object being preserved.

Such a method improves the creation of a circular staggered pattern from a circular pattern, and vice versa. A circular pattern is a pattern obtained by rotating an object about a rotation axis. The rotation axis may also be referred to as centre or origin. A circular staggered pattern is a circular pattern configuration in which some objects of the pattern are offset by a certain angle. The creation of a circular staggered pattern according to the invention is improved because the designer does not need to construct and put together patterns for creating a circular staggered pattern. The number of interaction between the user and the CAD system decreases in comparison with the background art; for instance, there is no need to create two patterns as in the prior art. Consequently, the method decreases the time that is necessary for creating a circular staggered pattern of objects. In addition, fewer resources such as memory or central processing unit (CPU) of CAD system are required for the creation of the staggered pattern of objects because the CAD system performs fewer operations. Furthermore, the method makes it possible to keep specifications of the duplicated objects inasmuch as the specifications of the reference object to be duplicated are inherited by the instantiated object. For instance, the instance of a through hole located on a support (e.g. a circular pad) will be kept as a through hole even if the support on with the through hole is duplicated is thicker at other location.

The method is computer-implemented. This means that the steps (or substantially all the steps) of the method are executed by at least one computer. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined.

For instance, the step of defining the number of objects to be instantiated from the reference object on each concentric circle, defining an angular deviation between two consecutive instantiated objects on a given concentric circle, defining an angular shift may be performed upon user action, e.g. the user may input information representing respectively a number of objects or values of the angular deviation and angular shift.

A typical example of computer-implementation of the method is to perform the method with a CAD system that may comprise a graphical user interface (GUI) suitable for this purpose. The GUI is coupled with a storage system and a processor. The storage system, which stores at least one an object (e.g. a reference object), may be merely any hardware suitable for such storage. The storage system may be a database or memory. Such a CAD system improves the design of a staggered pattern of objects: less time and hardware resources are required for designing a staggered pattern of objects in comparison with the prior art.

By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

In the case of the method, the database can comprise (or store) a reference object to be multi-instantiated.

The graphical user interface of the CAD system may comprise a a user-interactive graphical tool. The user-interactive graphical tool is adapted for triggering upon user action the designing of a staggered pattern of objects according to the present method. An example of GUI is depicted in reference to FIG. 9.

The method generally manipulates modeled objects. A modeled object is any object defined by data stored in the database. By extension, the expression "modeled object" designates the data itself According to the type of the system, the modeled objects may be defined by different kinds of data. The system may indeed be any combination of a CAD system, a CAE system, a CAM system, and/or a PLM system. In those different systems, modeled objects are defined by corresponding data. One may accordingly speak of CAD object, PLM object, CAE object, CAM object, CAD data, PLM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system suitable at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

A CAD system may be history-based. In this case, a modeled object is further defined by data comprising a history of geometrical features. A modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

By PLM system, it is meant any system suitable for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

By CAE system, it is meant any system suitable for the analysis of the physical behaviour of a modeled object. In a CAE system, a modeled object is thus defined by data suitable for the analysis of such behavior. This may be typically a set of behavioring features. For instance, a modeled object corresponding to a door may be defined by data indicating that the door rotates around an axis.

Figure 9:
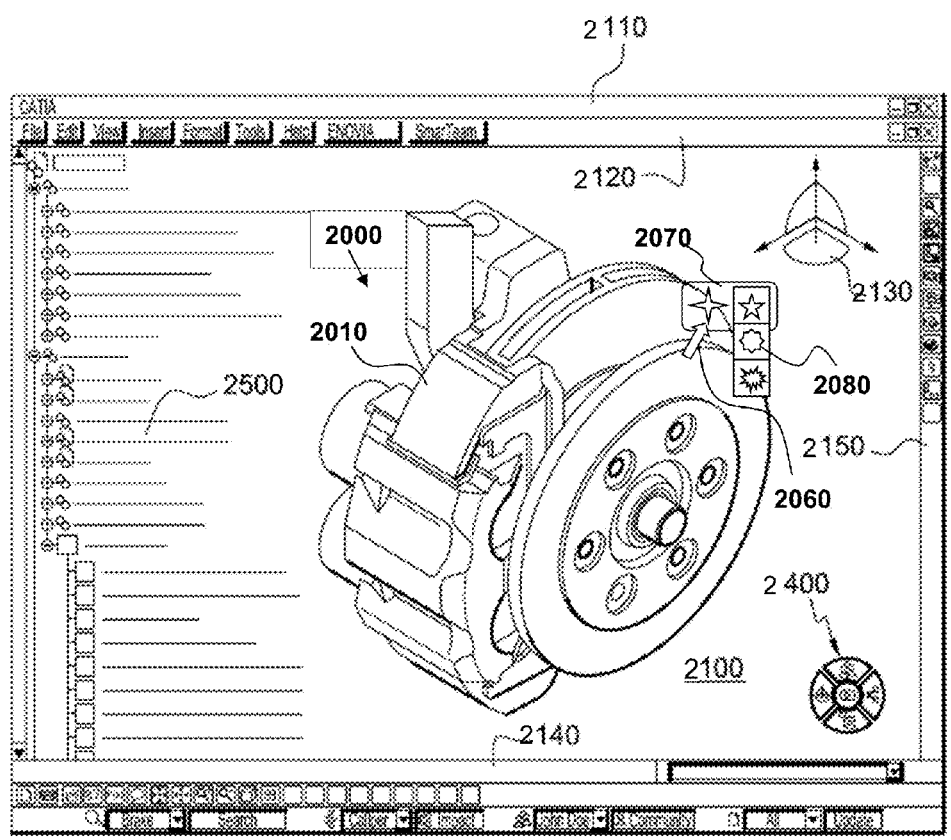
FIG. 9 shows an example of a graphical user interface.

FIG. 9 shows an example of the GUI of the system, wherein the system is a CAD system.

The GUI 2100 may be a typical CAD-like interface, having standard menu bars 2110, 2120, as well as bottom and side toolbars 2140, 2150. Such menu-and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 9, the data 2500, displayed as a feature tree, and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 10:
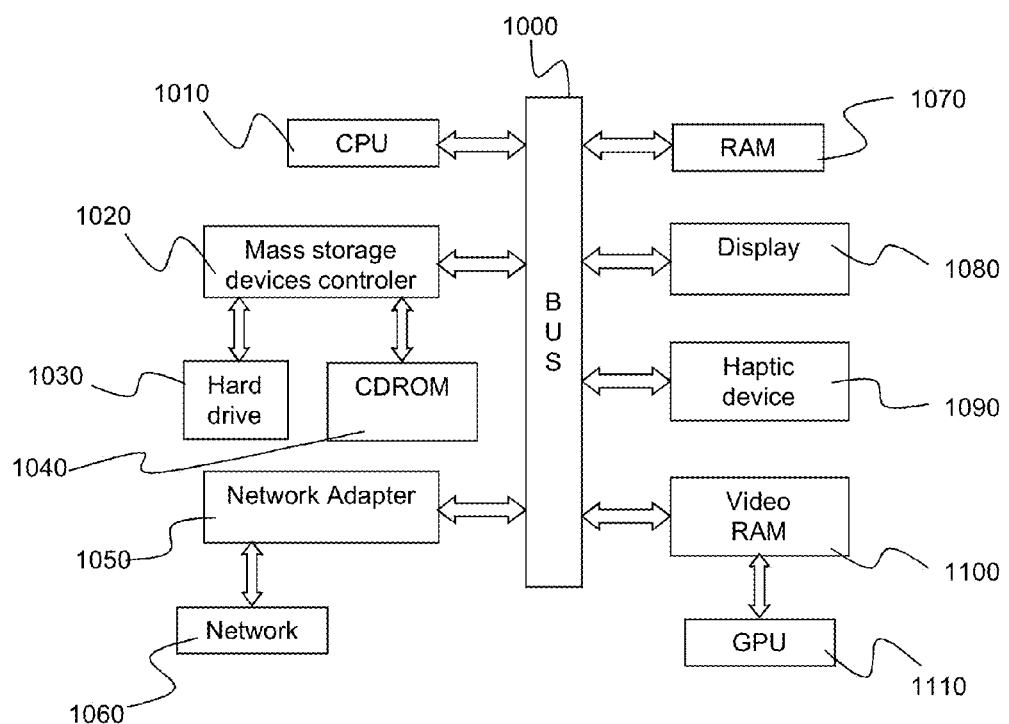
FIG. 10 shows an example of a client computer system.

FIG. 10 shows an example of a client computer system, e.g. a workstation of a user. The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080, as mentioned with reference to FIG. 9. In addition, the cursor control device allows the user to select various commands, and input control signals. The cursor control device includes a number of signal generation devices for input control signals to system. Typically, a cursor control device may be a mouse, the button of the mouse being used to generate the signals.

A computer program may comprise instructions by a computer, the instructions comprising means for causing the above system to perform the above method. The invention may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language.

It is now discussed the flowchart of FIG. 1 that shows an example of the present method.

At step 100, a rotation axis is provided; this means that the rotation axis is available to the CAD system so that the CAD system can perform operations on/with the rotation axis. The rotation axis may be provided upon user action, e.g. the user performs the selection of the rotation axis using a dedicated tool of the GUI depicted on FIG. 9. The user may also draw an axis in a 3D scene that is considered by the system as being a rotation axis. Alternatively, the axis may be automatically selected and provided by the CAD system. The rotation axis may be displayed to the user, e.g. on the GUI depicted on FIG. 9.

The rotation axis is the origin of two or more concentric circles. Rotation axis means the line around which one or more objects rotate. The rotation axis serves an origin (also referred to as a centre) for two or more concentric circles. The concentric circles are with one inside the other and share the same origin. The two or more concentric circles may be provided (step 102) automatically by the CAD system, e.g. concomitantly with the providing of the rotation axis. Alternatively, the two or more concentric circles may be provided upon user action. Providing the two or more concentric circles involves that they are available to the CAD system: the CAD system can perform operations on/with the concentric circles. The two or more concentric circles may be displayed to the user on the GUI, preferably with the rotation axis.

Figure 5:
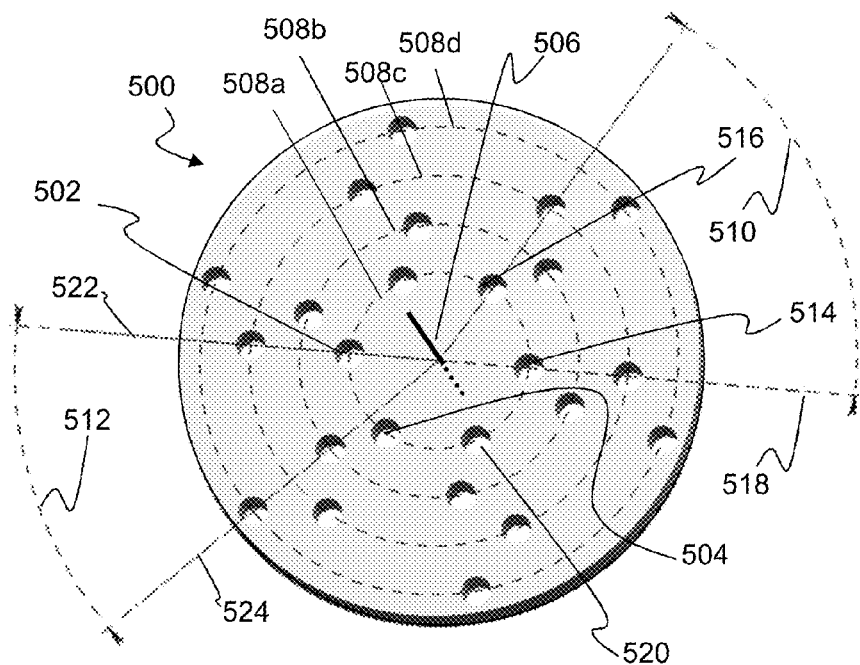
FIG. 5 illustrates an example of the creation of a configuration of a staggered pattern of objects according to the invention.

Referring now to FIG. 5, it is shown a rotation axis 506 that is the origin of four concentric circles 508a, 508b, 508c, and 508d. It is to be understood that the display on the GUI of the provided axis and/or concentric circles is not mandatory.

Referring back to FIG. 1, at step 104, a reference object to be multi-instantiated is provided, which involves that the reference object is now available for the CAD system; e.g. the CAD systems may instantiate the reference object and store the instantiated reference object in memory. At this step, a reference object is selected and transferred to the CAD system that can perform operation on it. The selection of the reference object can be performed as known in the art. For instance, this may be done thanks to the use of a tree, such as the one 2500 of FIG. 9. It is also possible for the user to select the reference object thanks to another type of user interface, for instance by inputting identification information for the reference object, by selecting the reference object in a list, or the like. The reference object may be selected thanks to any kind of user interface such as a combo-box, an icon, a special command, and so on.

Then, at step 106, it is defined the number of objects to be instantiated from the reference object on each concentric circle is selected. The number thus defines how many objects will be instantiated for each concentric circle. This number may be defined upon user action, e.g. by inputting a numerical value. Alternatively, the number of instances of the reference object may be defined by the system that provides a default value of a number of instances to compute. Thus, it results from this step 106 that the two or more concentric circles have an identical number of objects that will be instantiated from the reference object.

Next, at step 108, an angular deviation is defined between two consecutive instantiated objects on a given concentric circle. The angular deviation is determined about the origin of the circle and the position of an instantiated object that may be the reference object. The angular deviation is illustrated on FIG. 5: the angular deviation 510 between two consecutive instantiated objects 514, 516 positioned on the circle 508a. It is to be understood the term consecutive means that the instantiated objects are one after the other in order when following the circle about a given direction. The term consecutive is thus synonym of the term successive.

In practice, the angular deviation is computed according to the number of objects to be instantiated on each concentric circle: the angular deviation is computed so that all the objects to be instantiated on a concentric circle will be equidistant from each other, once they are instantiated on the concentric circle. In this case, the deviation angle in degree is the result of the ratio between an angle of 360 degrees and the number of object to be instantiated on each circle; the angular deviation can therefore be automatically defined by the CAD system upon computation of the ratio.

Alternatively, the angular deviation may be defined upon user action, e.g. the user may input information representing respectively a number of objects or values of the angular deviation and angular shift. In this case, the objects to be instantiated on a concentric circle will be not necessarily equidistant from each other.

Next, at step 110, an angular shift is defined, the angular shift being a rotation angle for performing a rotation about the rotation axis of a given concentric circle. This amount to say that the angular shift is a rotation angle for performing a rotation about the rotation axis of the instantiated objects on a concentric circle. The angular shift may be defined upon user action, e.g. the user input a numerical value, or it may be defined by the system, e.g. a default numerical value.

Then, at step 112, one or more values for specifying the definition of the circular staggered pattern may be defined (steps 114, 116). These values may be defined upon user action, e.g. the user input numerical values, or they may be defined by the system, e.g. default numerical values.

The number of concentric circles having the rotation axis as origin may be defined, at step 114. The minimum number of concentric circles is of two. The maximum number of concentric circles is not limited, or it may be limited for instance for computing resource considerations.

The spacing between two consecutive concentric circles may be defined, at step 116. This amounts to say that the distance between two consecutive concentric circles may be defined. The distance between two consecutive concentric circles is the measure of difference between the radius of each one of the two consecutive concentric circles. The two concentric circles are consecutive, which means that no other concentric circle is positioned between the two consecutive concentric circles. The spacing may be measured by, but not limited to, the Euclidian distance, a number of pixels, between the two consecutive concentric circles.

In practice, the two or more concentric circles may be positioned in a same plane. For instance, and in reference to FIG. 5, the four circles 508a, 508b, 508c, and 508d are positioned on one of the faces on the circular pad 500. The plane on which the concentric circles are position may be perpendicular to the rotation axis 506. In this configuration, two concentric circles are consecutive when no other concentric circle has a radius having a value comprised between the respective values of the two concentric circles.

The steps 100 to 116 may be contemplated as configurations steps of the present method. By configuration is meant objects and parameter for performing the method. A dedicated tool may be used for performing, upon user action, some or all the steps 100 to 116.

Figure 6:
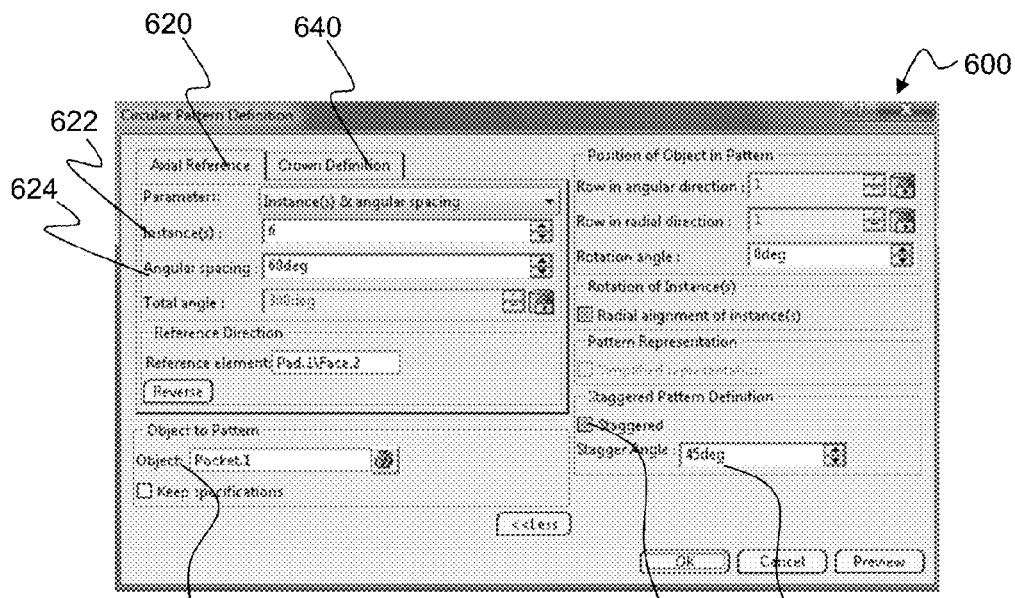
FIG. 6 is illustration of example of tools for configuring and/or creating a staggered pattern of objects.

Referring now to FIG. 6, tool 600 for configuring and/or creating a circular staggered pattern of object is shown. The tool 600 may be a user-interactive graphical tool that may be displayed in a GUI, e.g the GUI 2100 of FIG. 9. The tool 600 is adapted for configuring the creation of a circular staggered pattern of objects according to the method of the invention. The tool 600 provides several fields for displaying and/or inputting and/or selecting information relative to the circular staggered pattern to be created or created by the present method. One of these fields 610 allows the user to select the reference object to be provided. The user (e.g. a designer) can also select a tab 620 wherein fields are provided for inputting information of a circle: the user can define values such that the number of instances 622 on each circle, the value of the angular deviation 624 between each two consecutive instances on a circle. The user can further select a tab 640 wherein fields (not shown in FIG. 6) are provided for inputting information regarding the organization of the two or more circles each other: the user can define the spacing between two consecutive concentric circles, parameter of the rotation axis such as its location and/or orientation in the 3D space. The tool 600 may further provide a field 630 for defining the value of the angular shift. The values of the angular deviation and angular shift may be numerical value in degree, radian, or any other unit. The tool may further provide a graphical mean for triggering the creation of a staggered pattern of objects. For instance, the checkbox 650 may be selected so that a shifting of instantiated objects in one of every two concentric circle is performed in accordance with the angular shift defined in the field 630, as it will be described.

Referring back to the flowchart of FIG. 1, the steps 118 to 126 are now discussed.

At step 118, a first instantiated object is placed on one of the two or more concentric circles. This amounts to say that the first instantiated object is located on a concentric circle. The first instantiated object is one of the objects to be instantiated. It is to be understood that the term first in the expression first instantiated object is solely intended to designate a particular instantiated objects among the number of objects to be instantiated from the reference object.

Then, at step 120, a radial axis that passes from the rotation axis to the first reference object is computed. For instance, on FIG. 5, the instantiated object 514 is the first instantiated object, and the computed radial axis 518 is drawn from the rotation axis and passes through the reference object 514. As a result of the step 120, a set of intersections may be defined between the two or more concentric circles and the radial axis, and each intersection on each circle defines a position for an instance of the reference object. Thus, passing through the first instantiated object amounts to say that the radial axis intersects the circle on which the first instantiated object is located. The two or more concentric circles may be positioned on a same plane, and thus the radial axis will intersect each concentric circle and will define much as intersections as concentric circles. This is for instance represented on FIG. 7 that illustrates a radial axis 518 that defines four intersections with four circles (not represented) positioned on a single same place, wherein four instances of the reference object have been placed on the four defined intersections.

The first instantiated object may place on any of the two or more concentric circle. In practice, the first instantiated object is placed on the concentric circle having the smallest radius. This contributes to make easier the determination of the circles on which the shifting will be performed at step 126.

Next, at step 122, the number of objects to be instantiated is instantiated from the reference object on each concentric circle. The instantiated objects are spaced according to the angular deviation between two consecutive instantiated objects on a given concentric circle. As previously mentioned, the angular deviation may be computer according to the number of instantiated object on each circle, or upon user action. For instance, on FIG. 5, the number of instantiated object on each concentric circle is six. The angular deviation may be computed such that the instantiated objects to be placed on a circle are equidistant, which involves that the angular deviation between two successive instantiated objects is $$\frac{360°}{6} = 60°.$$

The instantiated objects are associated with their respective concentric circle. This association involves that the instantiated objects are positioned on their respective circle. Positioning means to the two or more objects are located on a concentric circle. The location may be performed as known in the art: the position of an instantiated object in the referential of the concentric circle can be used. The position of the instantiated object can be any point on the concentric circle. The position of an instantiated object on a circle may be determined based on the position of the reference object, the rotation axis and the angular deviation.

The angular deviation is typically measured from the radial axis computed at step 120. The radial axis may thus serves as a mark for measuring an angle on each circle. In practice, and as previously discussed, the radial axis may define one intersection on each concentric circle, each intersection corresponding to a location for one instance of the reference object, as illustrated on FIG. 7. In this case, the remaining objects are instantiated, placed each concentric circle, and spaced according to an angular deviation between two consecutive instantiated objects measured from the radial axis. The term remaining refers to the number of objects to be instantiated minus the first instantiated object.

Figure 7:
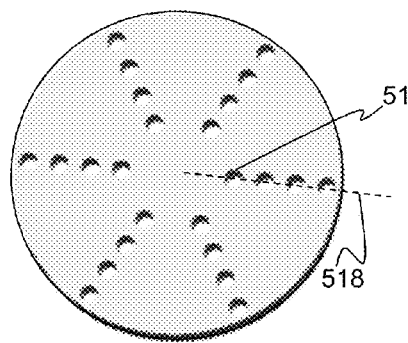
FIGS. 7-8 are illustrations of examples of patterns of objects created according to the invention.

At this step of the process, a circular pattern of objects is obtained and the objects may be displayed, at step 124. This is illustrated for instance on FIG. 7 showing a regular circular pattern of objects wherein the instantiated objects are aligned about an axis (e.g. the radial axis 518) and equidistantly spaced on each circle. The two or more concentric circles may be displayed when the instantiated objects are displayed, or even before the instantiated objects are displayed.

Then, in one of every two concentric circle, the instantiated objects are shifted in accordance with the angular shift, at step 126. Shifting means that the instantiated objects (in one of every two concentric circle) are moved along their respective circle from a first position to a second position, the second position being determined in accordance with the angular shift. The shifting is performed in one of every two concentric circle; this means that if the shifting is performed for a circle with a diameter $d_1$, no shifting will be performed for the preceding circle with a diameter $d_0$ ($d_1 > d_0$) and for the next circle with a diameter $d_3$ ($d_3 > d_1$), and a shifting is performed for a circle with a diameter $d_4$ ($d_4 > d_3$). In practice, a shifting is performed for all circles with a rank 2n+1 and no shifting is performed for all circle with a rank 2n, wherein n is a natural number. It is to be understood that the selection of the ranks on which shifting is performed is an arbitrary choice only.

The angular shift may be determined in a similar way as for the angular deviation at the instantiating step.

A second radial axis that passes from the rotation axis to an object positioned on a circle on which no shifting will be performed may be computed. For instance, on FIG. 5, the computed second radial axis 522 that passes through the instantiated object 502 on the concentric circle 508a is drawn. Then, angular shift is measured from the second radial axis. The second radial axis may thus serves as a mark for measuring an angle on each circle. Still in reference to FIG. 5, it is shown the angular shift 512, and the instantiated objects on the concentric circles 508b, 508d on which shifting is performed have been shifted.

Typically, radial axis and the second radial axis may be the same. This involves that the object through which the computed second radial axis passes is the first instantiated object, and the step of shifting in one of every two concentric circle the instantiated objects in accordance with the angular shift is not performed for the circle on which the first instantiated object is placed. This advantageously allows to reduce computing resource consumption inasmuch as only one radial axis has to be computed.

Figure 8:
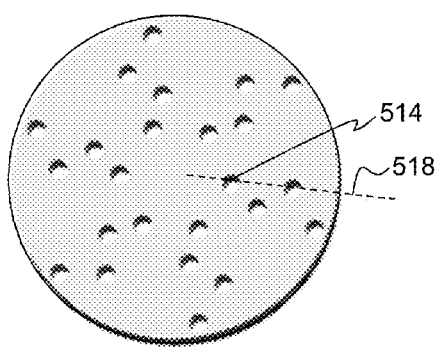

It is shown on FIG. 8 a representation of the circular staggered pattern of objects obtained from the circular pattern shown on FIG. 7. The shifting has been performed in accordance with an angular shift determined using the first instantiated object 514 through which the computed radial axis 518 passes, the first instantiated object 514 being placed on the concentric circle having the smallest radius among the four concentric circles.

Interestingly, it is possible to perform one or more supplementary steps of shifting, in one of every two concentric circle, the instantiated objects in accordance with the angular shift. For instance, a supplementary shifting made be performed in accordance with a second angular shift that is the opposite to the angular shift previously used for shifting the instantiated objects. This allows to easily perform a reverse shifting of a former shifting in order to get back a former configuration of the instantiated objects. For instance, the user can get back the staggered pattern of FIG. 7 from the circular staggered pattern of FIG. 8. Hence, the second angular shift advantageously allows to pass from the staggered to the initial circular pattern while keeping the reference object.

The preferred embodiment of the present invention has been described. It will be understood that various modifications may be made without departing from the spirit and scope of the invention. Therefore, other implementations are within the scope of the following claims.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for designing a staggered pattern of objects in a computer-aided design system, the method comprising:
   providing a rotation axis that is an origin of two or more concentric circles;
   providing a reference object to be multi-instantiated;
   defining a number of objects to be instantiated from the reference object on each concentric circle;
   defining an angular shift;
   instantiating the number of objects from the reference object on each concentric circle, the instantiated objects being spaced according to an angular deviation between two consecutive instantiated objects on a given concentric circle, and wherein the instantiating includes:
      placing a first instantiated object on one of the two or more concentric circles;
      computing a radial axis passing from the rotation axis to said first instantiated object; and
      instantiating remaining objects on each concentric circle, the remaining instantiated objects being spaced according to the angular deviation measured from the radial axis; and
   in one of every two concentric circle, shifting the instantiated objects in accordance with the angular shift.

2. The computer-implemented method of claim 1, further comprising the step of:
   defining a number of concentric circles.

3. The computer-implemented method of claim 1, further comprising the step of:
   defining a spacing between two consecutive concentric circles.

4. The computer-implemented method of claim 1, wherein the two or more concentric circles are positioned in a same plane.

5. The computer-implemented method of claim 1, wherein the step of shifting the instantiated objects in accordance with the angular shift in one of every two concentric circles is not performed for the circle that comprises the first instantiated object.

6. The computer-implemented method of claim 1, wherein the first instantiated object is placed on the concentric circle having the smallest radius.

7. The computer-implemented method of claim 1, further comprising a step of:
   shifting the instantiated objects previously shifted in accordance with a second angular shift that is opposite to the angular shift.

8. The computer-implemented method of claim 1, further comprising a step of:
   defining, upon user action, the angular deviation between the consecutive instantiated objects on a given concentric circle.

9. The computer-implemented method of claim 1, further comprising a step of:
   displaying the two or more concentric circles before the step of shifting.

10. A computer program product comprising:
    a non-transitory computer readable storage medium tangibly embodying instructions for execution by a computer, the instructions comprising means for performing the steps of:
    providing a rotation axis that is an origin of two or more concentric circles;
    providing a reference object to be multi-instantiated;
    defining a number of objects to be instantiated from the reference object on each concentric circle;
    defining an angular shift;
    instantiating the number of objects from the reference object on each concentric circle, the instantiated objects being spaced according to an angular deviation between two consecutive instantiated objects on a given concentric circle, and wherein the instantiating includes:
       placing a first instantiated object on one of the two or more concentric circles;
       computing a radial axis passing from the rotation axis to said first instantiated object; and
       instantiating remaining objects on each concentric circle, the remaining instantiated objects being spaced according to the angular deviation measured from the radial axis; and
    in one of every two concentric circle, shifting the instantiated objects in accordance with the angular shift.

11. A computer program product according to claim 10, wherein the step of shifting the instantiated objects in accordance with the angular shift in one of every two concentric circles is not performed for the circle that comprises the first instantiated object.

12. A computer-aided design system comprising:
    a storage system for storing a reference object to be multi-instantiated;
    a processing unit operatively coupled to the storage system and configured to:
    provide a rotation axis that is an origin of two or more concentric circles;
    obtain from the storage system the reference object to be multi-instantiated;
    define the number of objects to be instantiated from the reference object on each concentric circle;
    define an angular shift;
    instantiate the number of objects from the reference object on each concentric circle, the instantiated objects being spaced according to an angular deviation between two consecutive instantiated objects on a given concentric circle; and
    in one of every two concentric circle, shift the instantiated objects in accordance with the angular shift,
    wherein instantiation by the processing unit is further configured to:
    place a first instantiated object on one of the two or more concentric circles;

compute a radial axis passing from the rotation axis to said first instantiated object; and instantiate remaining objects on each concentric circle, the remaining instantiated objects being spaced according to the angular deviation measured from the radial axis.

13. The computer-aided design system of claim 12, wherein the processing unit further defines a number of concentric circles.

14. The computer-aided design system of claim 12, wherein the processing unit further defines a spacing between two consecutive concentric circles.

15. The computer-aided design system of claim 12, wherein the two or more concentric circles are positioned in a same plane.

16. The computer-aided design system of claim 12, wherein the shift of the instantiated objects in accordance with the angular shift in one of every two concentric circles is not performed for the circle that comprises the first instantiated object.

17. The computer-aided design system of claim 12, wherein the first instantiated object is placed on the concentric circle having the smallest radius.

18. The computer-aided design system of claim 12, wherein the processing unit is further configured to:

shift the instantiated objects previously shifted in accordance with a second angular shift that is opposite to the angular shift.

\* \* \* \* \*